(12) United States Patent
Kitada et al.

(10) Patent No.: US 7,279,790 B2
(45) Date of Patent: Oct. 9, 2007

(54) SEMICONDUCTOR DEVICE AND A MANUFACTURING METHOD THEREOF

(75) Inventors: Hideki Kitada, Kawasaki (JP); Noriyoshi Shimizu, Kawasaki (JP); Nobuyuki Ohtsuka, Kawasaki (JP); Takayuki Ohba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/105,286

(22) Filed: Mar. 26, 2002

(65) Prior Publication Data

US 2003/0042610 A1 Mar. 6, 2003

(30) Foreign Application Priority Data

Aug. 29, 2001 (JP) ............................. 2001-260377

(51) Int. Cl.
*H01L 23/48* (2006.01)
(52) U.S. Cl. ..................................................... 257/758
(58) Field of Classification Search ................. 257/758
See application file for complete search history.

(56) References Cited

U.S. PATENT DOCUMENTS

| | | | | |
|---|---|---|---|---|
| 4,720,908 A | * | 1/1988 | Wills | ........................... 438/643 |
| 5,341,026 A | * | 8/1994 | Harada et al. | ............... 257/764 |
| 5,470,792 A | | 11/1995 | Yamada | ....................... 437/155 |
| 5,759,915 A | * | 6/1998 | Matsunaga et al. | .......... 438/627 |
| 5,891,804 A | | 4/1999 | Havemann et al. | .......... 438/674 |
| 6,130,157 A | | 10/2000 | Liu et al. | ..................... 438/669 |
| 6,174,810 B1 | * | 1/2001 | Islam et al. | .................. 438/687 |
| 6,326,301 B1 | * | 12/2001 | Venkatesan et al. | ......... 438/638 |
| 6,362,526 B1 | * | 3/2002 | Pramanick et al. | .......... 257/751 |
| 6,376,377 B1 | * | 4/2002 | Chang et al. | ................ 438/689 |

FOREIGN PATENT DOCUMENTS

| | | |
|---|---|---|
| CN | 1216398 A | 5/1999 |
| CN | 395040 | 6/2000 |
| EP | 0 788 156 | 8/1997 |
| EP | 0 913 863 A2 | 5/1999 |
| JP | 2000332106 A | 11/2000 |
| JP | 2001044205 A | 2/2001 |

* cited by examiner

*Primary Examiner*—Sara Crane
*Assistant Examiner*—Samuel A. Gebremariam
(74) *Attorney, Agent, or Firm*—Westerman, Hattori, Daniels & Adrian, LLP.

(57) ABSTRACT

A multilayer interconnection structure that offers a fast semiconductor operation is realized by employing copper wiring, electro migration of which is prevented from occurring by providing a via plug that includes a layer of a high melting-point metal, such as tungsten.

6 Claims, 7 Drawing Sheets

- 25 SiO₂ FILM
- 23 Cu WIRING
- 19 BARRIER METAL LAYER
- 17 SiO₂ FILM
- 15 Cu WIRING
- 13 BARRIER METAL LAYER
- 11 SiO₂ FILM
- 10 Si SUBSTRATE
- 21 VIA PLUG

- 45 SiO₂ FILM
- 43 Cu WIRING
- 39 BARRIER METAL LAYER
- 41 VIA PLUG
- 37 SiO₂ FILM
- 35 Cu WIRING
- 33 BARRIER METAL LAYER
- 31 SiO₂ FILM
- 30 Si SUBSTRATE
- 42 Cu LAYER
- 47 W LAYER

FIG.3

| METAL MATERIAL | MELTING POINT (°C) | $\rho$ ($\mu\Omega$cm) |
|---|---|---|
| Au | 1064.43 | 2.04 |
| Ag | 961.93 | 1.51 |
| Cr | 1890 | 12.7 |
| Co | 1494 | 5.6 |
| W | 3387 | 4.9 |
| Ta | 2996 | 12.6 |
| Fe | 1535 | 8.9 |
| Ni | 1455 | 6.14 |
| Pt | 1772 | 9.81 |
| Pd | 1554 | 10.21 |
| Mo | 2610 | 5.2 |
| Rh | ... | 4.3 |
| Cu | 1084.5 | 1.56 |
| Al | 660.4 | 2.45 |

SEMICONDUCTOR DEVICE AND A MANUFACTURING METHOD THEREOF

BACKGROUND OF THE INVENTION

1. Field of the Invention

The present invention generally relates to a semiconductor device and a manufacturing method thereof, and particularly relates to the semiconductor device that has multilayer interconnection structure, and the manufacturing method thereof.

2. Description of the Related Art

Miniaturization of wiring design rule of semiconductor devices is progressing with rapid development of ULSI (Ultra Large Scale Integration) technology. The number of elements that should be integrated is increasing, and wiring is becoming complicated by the large scale integration. Multilayer interconnection attracts attention in order to cope with this situation.

In the multilayer interconnection, however, delay due to complicated wiring is a concern, and Cu wiring is attracting attention because of a low resistance value, especially in wiring of logic LSIs.

FIG. 1 is a figure explaining wiring structure of a conventional semiconductor device.

With reference to FIG. 1, a silicon dioxide ($SiO_2$) film 11 is formed as an inter-layer film in a device (not shown) formed on a semiconductor substrate 10. On the $SiO_2$ film 11, Cu wiring 15 is formed as lower layer wiring through a barrier metal layer 13 that is made of a material such as tantalum nitride and tantalum.

Further, an $SiO_2$ film 17 is formed on the SiO2 film 11, as an inter-layer film, wrapping the Cu wiring 15. A via plug 21 is formed such that the $SiO_2$ film 17 is penetrated and the Cu wiring 15 is touched through a barrier metal layer 19 that is made of a material such as tantalum nitride and tantalum.

Further, on $SiO_2$ film 17, Cu wiring 23 serving as upper wiring is formed contiguously with the via plug 21 that touches the Cu wiring 15 through the barrier metal layer 19 that is made of a material such as tantalum nitride and tantalum. Further, on the $SiO_2$ film 17, an $SiO_2$ film 25 is formed, contacting with the barrier metal layer 19.

For example, when current flows from the Cu wiring 23 to the Cu wiring 15 through the via plug 21, an electron flows from the Cu wiring 15 to the Cu wiring 23 through the via plug 21.

At this time, the copper atom in the via plug 21 tends to move toward the direction of the Cu wiring 23, like electron flow, according to an electro migration phenomenon. Consequently, a void occurs on the side of the Cu wiring 15 of the via plug 21, due to the copper atom in the via plug 21 moving.

In conventional aluminum (Al) wiring used in logic LSI wiring, tungsten (W) has been used for the via plug. Developments have been made such that the migration of aluminum is suppressed, life distribution of aluminum wiring is suppressed, and high reliability is available.

Recently, in consideration of high-speed processing, practices are shifting to use Cu wiring that has a lower electric resistance than aluminum wiring. As for the Cu wiring, dual damascene processing is being established. All elements of a lamination, wiring—via plug—wiring, are made of Cu. Since the atomic weight of Cu is larger than aluminum, Cu is more resistive against electro migration. However, local current concentration still arises to a via plug in the Cu wiring laminated structure that is miniaturized, causing a poor wiring by a void generated as explained above.

Since the lower resistance of the Cu wiring is a highly desirable matter, wiring structure that can suppress the electro migration of Cu is desired, with attention paid to structure of the via plug.

SUMMARY OF THE INVENTION

A general object of the present invention is to provide a semiconductor device and a manufacturing method thereof that substantially obviate one or more of the problems caused by the limitations and disadvantages of the related art.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by the semiconductor device and the manufacturing method thereof particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides the semiconductor device in which electro migration is suppressed, while maintaining a high-speed operation, paying attention to the structure of the via plug, and its manufacturing method.

In order to attain the object, the semiconductor device of the present invention includes a first wiring and a second wiring that are prepared on an upper surface and under a lower surface, respectively, of an inter-layer insulation film, and a via plug that connects the first wiring and the second wiring. The via plug is configured to include at least one layer of a high melting-point metal, thickness of which is a part of the thickness of the via plug, and the metal that forms this layer has a melting point that is higher than the melting point of the metal that forms the first wiring and the second wiring.

As for the via plug, it is desirable to have one layer of high melting-point metal, and, it is desirable that the laminating is carried out such that the high melting-point metal layer touches the first wiring and the second wiring through a barrier metal layer.

Further, it is desirable that the first wiring, the second wiring, and the via plug are formed by copper or a copper alloy, and the high melting-point metal layer is formed by a tungsten. Further, it is desirable that the high melting-point metal layer is formed in a thickness that ranges between 10 nm and 100 nm.

The high melting-point metal layer can be formed on a surface of the metal exposed in the via plug by a chemical vapor depositing method, for example, choosing suitable deposition conditions, and suppressing deposition on the inter-layer insulation film surface, in a self-aligning forming without using a mask process.

The semiconductor device of the present invention has multilayer interconnection structure, and embodiments of the present invention employ Cu wiring structure that is attracting attention as the wiring structure that contributes to a fast operation. Here, new structure of a via plug, which suppresses the electro migration of Cu in Cu wiring structure is illustrated. Especially, selection criterion of a metal that forms a part of the thickness of the via plug, requirements of the metal layer from a viewpoint of the electro migration of Cu, and the like will be described.

According to the present invention, reliability of a super-miniaturized and high-speed semiconductor device can be greatly enhanced by forming a middle layer of a high melting-point metal, such as tungsten (W), that has a large resistance against the electro migration, inside of the via hole where current concentration tends to grow in the Cu multilayer interconnection structure, in thickness that is sufficient to perform as a barrier against the electro migration, and that does not cause effective electric resistance to increase, in only a part in a depth direction of the via hole. According to the present invention, the middle layer of the high melting-point metal can be formed in a self-alignment manner, avoiding an increase in the number of mask processes.

BRIEF DESCRIPTION OF THE DRAWINGS

FIG. 3 is a figure explaining a metal material used as a high melting-point metal layer in the semiconductor device of the embodiments of the present invention;

DESCRIPTION OF THE PREFERRED EMBODIMENTS

In the following, embodiments of the present invention will be described with reference to the accompanying drawings.

Figure 1:
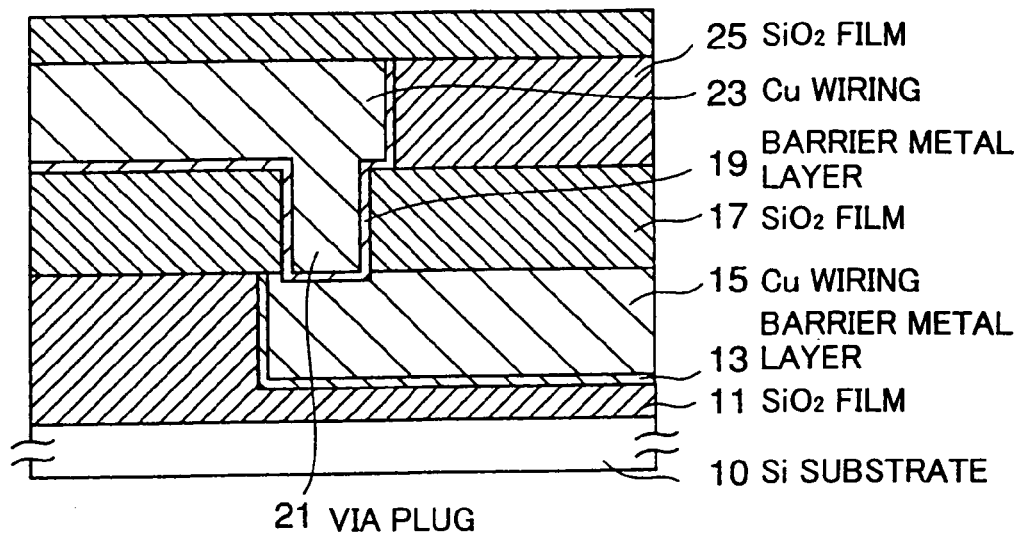
FIG. 1 is a figure explaining wiring structure of a conventional semiconductor device.
Figure 2:
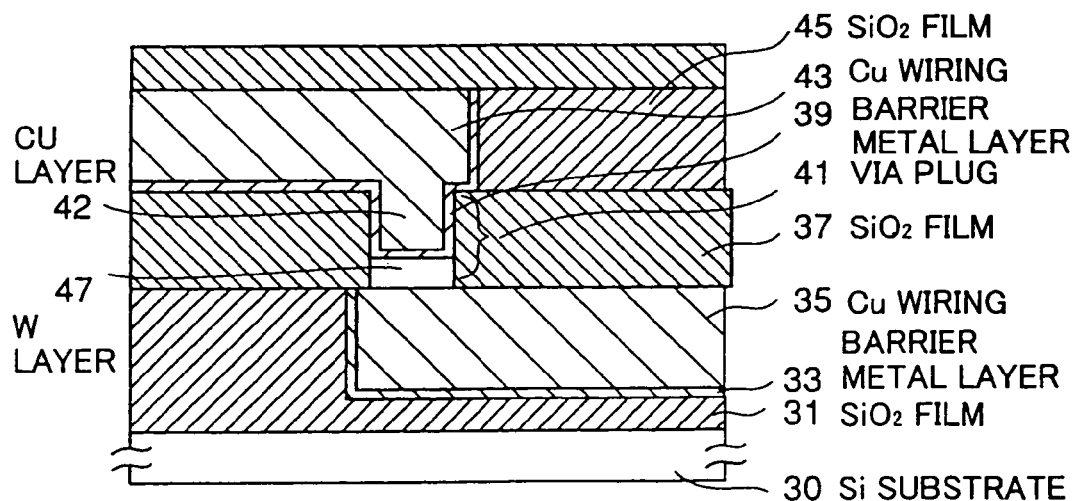
FIG. 2 is a figure explaining wiring structure of a semiconductor device of embodiments of the present invention.

FIG. 2 is a figure explaining wiring structure of the semiconductor device of the embodiments of the present invention.

The semiconductor device of the embodiment has multilayer interconnection structure that employs Cu wiring 35 and Cu wiring 43. In a via plug 41, a Cu layer 42 formed contiguously with the Cu wiring 43, and a W layer 47 as a high melting-point metal layer are included. The metal material adopted as this high melting-point metal layer is chosen with reference to the melting point and the specific resistance of Cu that forms the Cu wiring 35, the Cu wiring 43, and the Cu layer 42, and is formed in predetermined thickness.

With reference to FIG. 2, the wiring structure of the semiconductor device of the embodiment is explained. First, on a semiconductor (Si) substrate 30, a silicon dioxide ($SiO_2$) film 31 as an inter-layer film to wrap a device (not shown) formed on this substrate. In the present embodiment, the $SiO_2$ film 31 is formed in about 400 nm thickness.

Next, a barrier metal layer 33 is formed on the $SiO_2$ film 31. The barrier metal layer 33 is formed in order that the atom of Cu used as wiring material is prevented from being spread in the $SiO_2$ film 31 in a wiring process etc. The barrier metal layer 33 is formed in about 20 nm thickness in the present embodiment.

On the barrier metal layer 33, the Cu wiring 35 serving as lower layer wiring is formed. In the present embodiment, the Cu wiring 35 is formed in about 300 nm thickness. Further, on the $SiO_2$ film 31, an $SiO_2$ film 37 as an inter-layer film that wraps the Cu wiring 35. The $SiO_2$ film 37 is formed in about 400 nm thickness in the present embodiment.

The via plug 41 penetrates the $SiO_2$ film 37, and connects the Cu wiring 35 and the Cu wiring 43. As mentioned above, the via plug 41 in the present embodiment includes a W layer 47 as the high melting-point metal layer, and a Cu layer 42 formed contiguously with the Cu wiring 43.

A barrier metal layer 39 is formed on the $SiO_2$ film 37. The barrier metal layer 39 has two roles in the present embodiment. A first role is preventing the atom of Cu used as wiring material from being spread in the $SiO_2$ film 37 and the $SiO_2$ film 45 during wiring process etc. A second role is forming a double layer with the W layer 47 in order to prevent Cu from spreading (double Cu spread prevention layer), and preventing Cu atom from spreading by electro migration. The barrier metal layer 39 is formed in about 20 nm thickness in the present embodiment.

On the barrier metal layer 39, the Cu wiring 43 serving as upper wiring is continuously formed with the Cu layer 42. The Cu wiring 43 is formed in about 300 nm thickness in the present embodiment. Further, on the $SiO_2$ film 37, an $SiO_2$ film 45 as inter-layer film is formed so that the Cu wiring 43 may be surrounded. $SiO_2$ film 45 is formed in about 400 nm thickness in the present embodiment.

Here, the structure of the via plug 41 is explained more specifically. The W layer 47 is prepared in a lower part of the via plug 41, and an undersurface of the W layer 47 is directly in contact with the Cu wiring 35. On the other hand, an upper surface of the W layer 47 is in contact with the Cu layer 42 through the barrier metal layer 39. Therefore, in the present embodiment, the barrier metal layer 39 is formed between the W layer 47 and the Cu layer 42 that constitute the via plug 41.

Thickness of the via plug 41 prepared by penetrating the $SiO_2$ film 37 is about 400 nm, of which about 50 nm is occupied by the W layer 47. Thus, the W layer 47 is formed very thinly so that the low resistance of the Cu wiring is not spoiled.

In this manner, the semiconductor device of the present embodiment has the wiring structure that includes the Cu wiring 35 and the Cu wiring 43, and the via plug 41 that connects the Cu wiring 35 and the Cu wiring 43 that are formed on the upper and the lower surfaces of the $SiO_2$ film 37, respectively. Here, the via plug 41 includes a W layer 47 as a metal layer that has a melting point higher than Cu that is used as wiring metal.

While a high-speed operation due to the low resistance of the Cu wiring can be enjoyed, according to the wiring structure shown in FIG. 2, suppression of the migration of Cu is also coped with. The reason is given below. A first viewpoint is selecting a material as the high melting-point metal layer as a means for suppressing the migration of Cu (refer to FIG. 3). A second viewpoint is thickness (refer to FIG. 4) of the metal layer, which affects operation speed of the semiconductor device.

The first viewpoint will be explained. In the present embodiment, the via plug 41 has the tungsten (W) layer 47 as a high melting-point metal layer in addition to the Cu layer 42 so that the Cu wiring 35 is connected directly. Tungsten (W) has a melting point higher than copper (Cu) that forms the Cu wiring 35, the Cu wiring 43 and the Cu layer 42.

FIG. 3 is a list of metal materials applicable to the semiconductor device of the present embodiment as the high melting-point metal layer.

A first requirement of the metal layer formed in a part of the via plug 41 in the Cu wiring is to suppress an electron transfer (movement of a copper atom) within the via plug 41 where electric current concentrates. Accordingly, metal that has a capability to suppress the electron transfer (movement of a copper atom) is searched. Specifically, metal material with a high melting point (or an atomic number is large) compared with Cu that is the wiring metal is chosen. This is based on "the higher the melting point of metal is, the harder the metal atom moves". In addition, metal to be chosen must not react with Cu that is wiring metal, otherwise the metal forms a high resistance layer.

FIG. 3 shows melting points and specific resistances of metal materials, such as gold (Au), silver (Ag), and cobalt (Co). In the present embodiment, tungsten (W) that has a melting point of 3387 degrees C., i.e., more than 3 times as high as copper (Cu) (1084.5 degrees C.) is chosen. As mentioned later, wiring process by the self-alignment by CVD becomes possible by using tungsten (W).

With reference to FIG. 2, when current is to flow from the Cu wiring 43 to the Cu wiring 35 through the via plug 41, an electron transfer from the Cu wiring 35 to the Cu wiring 43 is suppressed by the higher melting point of W, i.e., a lower electron mobility of W, comparing with Cu. Thereby, movement of Cu atom in the via plug 41 that is about to move according to the electron transfer can be suppressed.

Furthermore, as mentioned above, the barrier metal layer 39 prepared between the Cu layer 42 and the W layer 47 suppresses spreading of Cu by the electro migration, like the 47 W layer. Electro migration resistance is reinforced in this manner by a double layer of the barrier metal layer 39 and the W layer 47.

Next, the second viewpoint will be explained. In the present embodiment, the W layer has very thin thickness, being formed in a small part of the thickness of the via plug 41. This is because the specific resistance of W (about 4.9 μΩ-cm) is greater than the specific resistance of Cu (about 1.56 μΩ-cm). By making a total resistance of the via plug 41 as low as possible, an amount of delay of the whole Cu wiring can be reduced, and a high-speed operation is attained.

Figure 4:
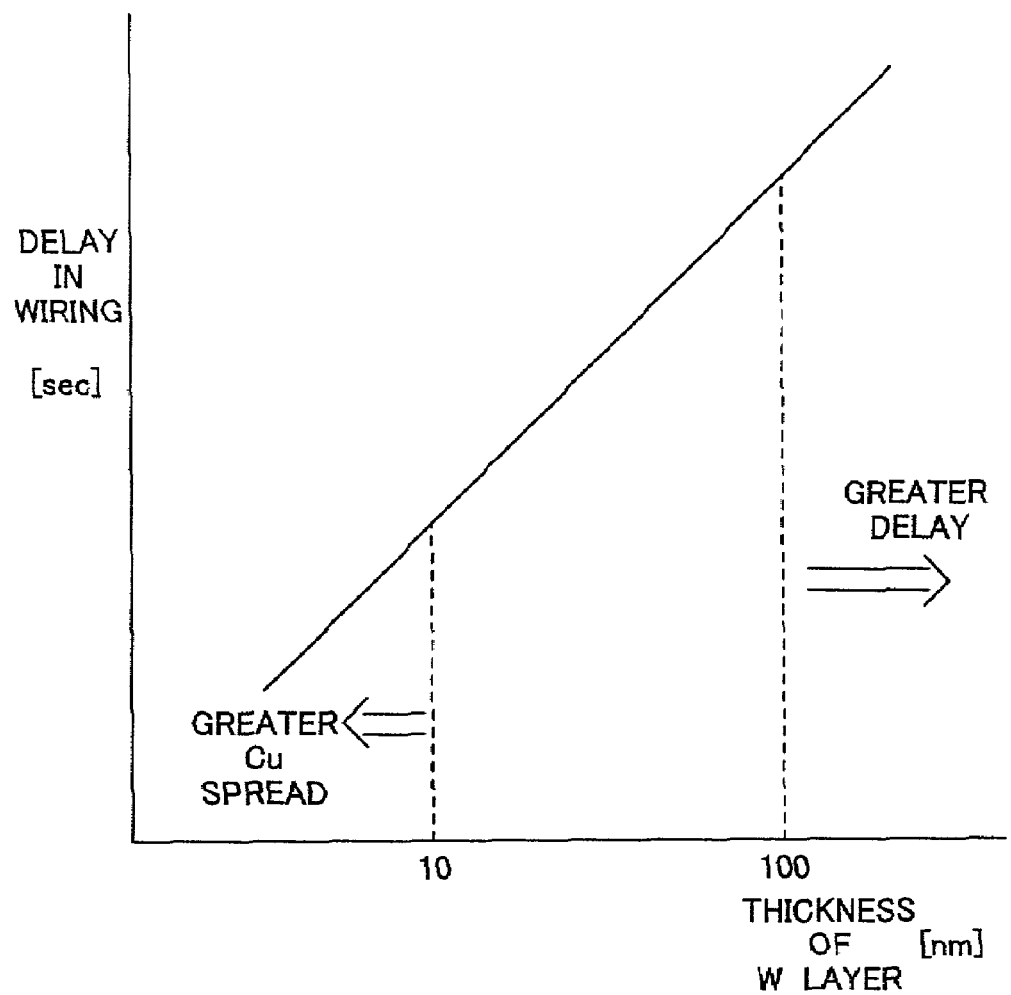
FIG. 4 is a figure explaining thickness of a tungsten (W) layer in the semiconductor device of the embodiments of the present invention.

FIG. 4 is a figure that explains about thickness of the W layer 47 in the semiconductor device of the present embodiment. This figure illustrates a basic concept of how an amount of delay in the whole Cu wiring increases with thickening of the W layer 47.

Thickness of the W layer 47 is determined by a degree of Cu spreading at a certain temperature, when an electric field is impressed between the Cu wiring 35 and the Cu wiring 43 through the via plug 41. The thickness of the W layer 47 prepared in order to suppress spread of Cu to some extent can be formed very thinly (about 50 nm) compared with thickness of the via plug 41 (about 400 nm) that is the same as the SiO$_2$ film 37.

Figure 5:
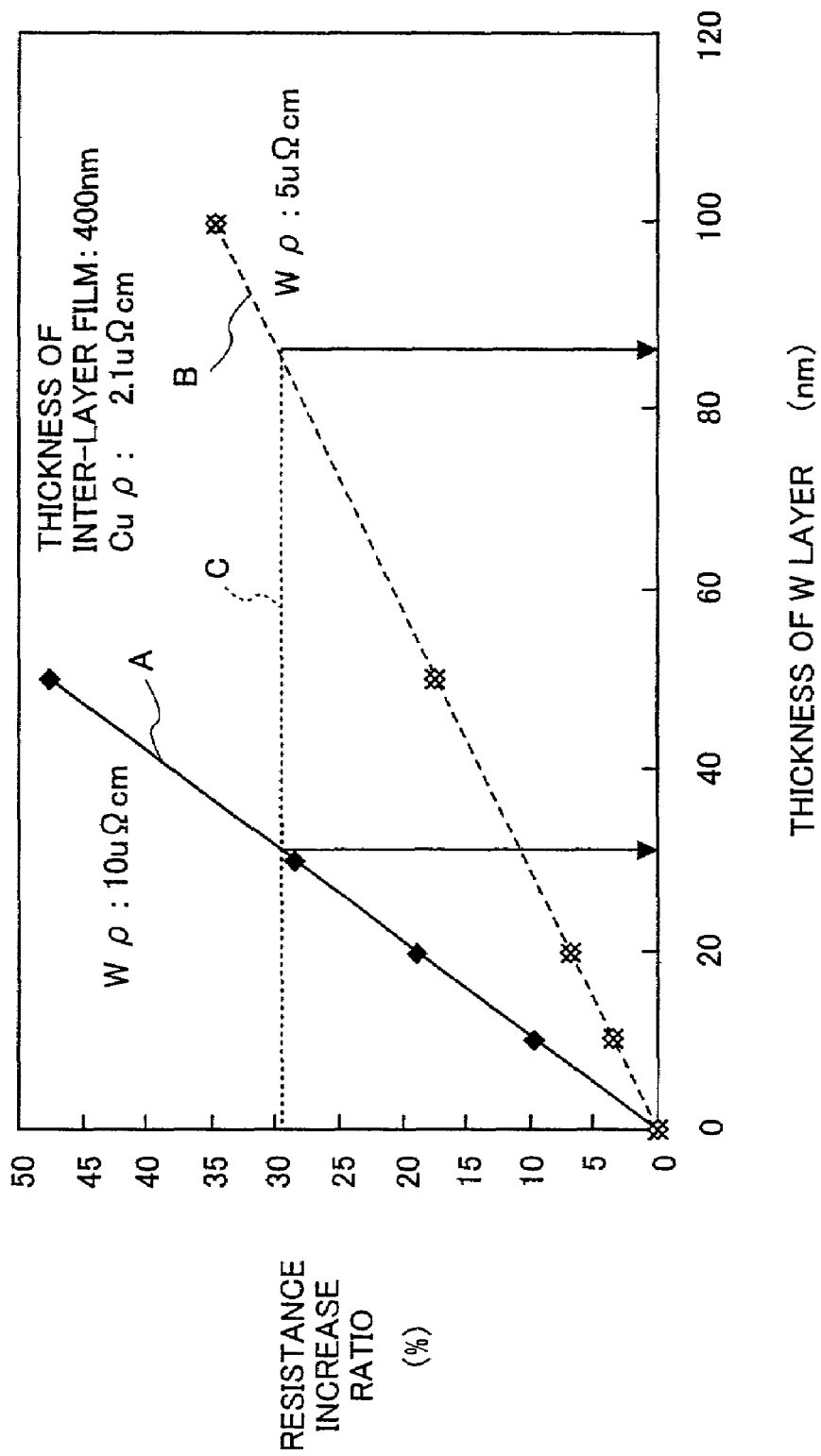
FIG. 5 is a figure explaining the thickness range of the W layer in the semiconductor device of the embodiments of the present invention.

It is desirable that the thickness of the W layer of 47 is set between 10 nm and 100 nm as shown in FIG. 4. If the thickness is set at 10 nm or less, spread of Cu becomes large, and if the thickness is set at 100 nm or more, electric resistance of the W layer 47 becomes large, causing the amount of delay of the whole Cu wiring including the via plug 41 to become large. Thus, the high-speed operation attained by the Cu wiring that has low resistance is kept available by choosing the thickness of the W layer 47 appropriately. FIG. 5 explains restrictions concerning the thickness of the W layer 47.

Furthermore, in the present embodiment, the barrier metal layer 39 works not only during wiring process and the like, but also during operation, contributing to suppress the Cu spreading. According to this structure, the thickness of the W layer 47 can further be reduced, by selecting a material, thickness, and the like of the barrier metal layer 39.

FIG. 5 is a figure explaining thickness range of the W layer 47 of the semiconductor device of the embodiment. Here, the thickness of the W layer 47 will be explained based on estimation of wiring resistance calculated.

First, electric resistance of the via plug 41 when the via plug 41 includes W and Cu is shown as follows.

$$R = R1 + R2$$
$$= \rho1 \times L1/S + \rho2 \times L2/S$$
$$= (8.4L1 + 40L2) \times 10^{-5}/\pi d^2$$

Here, R1 is resistance of Cu and R2 is resistance of W. Further, ρ1 is the specific resistance (2.1 μΩ-cm) of Cu, and ρ2 is the specific resistance (10 μΩ-cm) of W (here, the specific resistance of CVD-W is used). Further, L1 is the thickness of Cu (the Cu layer 42) that forms a part of the via plug 41, and L2 is the thickness of W (the W layer 47) that forms another part of the via plug 41. Furthermore, S is equivalent to πd$^2$/4, where D is a diameter of the via plug.

For example, like the present embodiment, resistance of the via plug 41 diameter of which is 0.2 micrometers is calculated as follows, where an assumption is that the thickness of SiO$_2$ film 37 is 400 nm, the thickness of the W layer 47 is 50 nm, providing L1=350 nm, L2=50 nm, and d=0.2.

$$R = R1 + R2$$
$$= 0.234 + 0.159$$
$$= 0.393 \text{ } (\Omega)$$

That is, compared with the case where W is not used (0.234Ω×400/350=0.267Ω), the resistance of the via plug 41 goes up by 47%.

FIG. 5 shows relationships between the thickness of the W layer 47 and an increasing rate of the resistance of the via plug 41 as a whole (corresponding to delay time), when the thickness of the SiO$_2$ film 37 is fixed at L=L1+L2=400 nm.

In FIG. 5, a solid straight line indicated by A shows the case of the specific resistance (ρ2=10 μΩ-cm) by W-CVD in realistic level, and a dashed straight line indicated by B shows the case of the specific resistance (ρ2=5 μΩ-cm) by W-CVD in a prospective level in the future.

The range of the thickness of the W layer specified in the present embodiment is prescribed by the minimum based on the solid straight line A, and the maximum based by the dashed straight line B. Specifically, the range is prescribed by restrictions from a presently available thin film growing process of the W layer 47 based on the solid straight line A, and from the outside about the device design including elements by a prospective improvement in technology as indicated by the dashed straight line B. These points will be explained in detail in the following.

First, the minimum thickness is explained. In the thin film growth process, general metal growth requires about 10 nm thickness such that a continuation film is obtained from a 2-dimensional core. If a continuation film is not obtained, there is a possibility that the barrier performance to Cu flow may deteriorate extremely.

Next, the maximum thickness is explained. In order to maintain the high-speed operation that the Cu wiring offers, the resistance increase ratio permissible per via plug is set at 30% (level "C" in FIG. 5) in the present embodiment. The 30% level is permissible conditions required from the outside, such as circuit design.

In this case, if the specific resistance in the bulk value of W is taken into consideration, up to 90 nm (not shown) is permissible. If the specific resistance in the present W-CVD is taken into consideration, up to about 30 nm is permissible, based on the solid straight line A. Furthermore, it is expected that the specific resistance of W-CVD gets lower in the future such that up to about 100 nm will be permissible based on the dashed straight line B.

For example, when forming the via plug 41 only by W, a configuration the via plug (only W)-Cu wiring—via plug (only W) of a single pitch will provide a large resistance. This is clear from the difference in the specific resistance between W and Cu. It is also easily understood from the inclination of the solid straight line A that indicates that the advantage of the Cu wiring is spoiled greatly with an increased thickness of the W layer.

As mentioned above, the range of about 10 to about 100 nm is the optimum thickness range of the W layer 47, at which both the electro migration resistance of Cu and the wiring resistance are satisfactory.

FIG. 6 is a manufacturing process flowchart explaining the manufacturing method of the semiconductor device of the embodiment. Here, the process flow by dual damascene of a two-layer wiring that has lower layer wiring and upper wiring is explained using FIG. 6(A) through FIG. 6(D).

With reference to FIG. 6 (A), the $SiO_2$ film 31 is first formed as inter-layer film on the Si substrate 30. In the present embodiment, the $SiO_2$ film 31 is formed in about 400 nm thickness by a plasma-CVD method.

Next, the silicon-nitride (SiN) film 48 as an etching stopper is formed. In the present embodiment, the silicon-nitride (SiN) film 48 is formed in about 30 nm thickness by the CVD or a sputtering method.

Next, preparations for forming a first wiring layer, i.e., the Cu wiring 35 are made. First, a trench that is an area in which the Cu wiring 35 is formed is opened by width of about 0.2 micrometers by a photolithography process and an etching process. Subsequently, photoresist on a surface of the SiN film 48 is removed, and the SiN film 48 including a surface of the trench is washed by resist removal process and washing process, respectively.

Next, the barrier metal layer 33 and a Cu seed layer (not shown) are formed by PVD on the surface of the trench. In the present embodiment, the barrier metal layer 33 is formed at about 20 nm thickness, using TaN as the material. Further, the Cu seed layer is formed in about 100 nm thickness by CVD or sputtering.

Finally, a plating film of Cu is formed by a plating process, and the trench is padded. Here, the plating film of Cu is formed in about 300 nm thickness by electrolysis plating. Then, a Cu layer and a barrier metal layer (not shown) that are left behind on the first wiring layer are removed by a CMP process.

Next, a second wiring layer is formed. First, the $SiO_2$ film 37 is formed as an inter-layer insulation film. This $SiO_2$ film 37 corresponds to a layer (not shown) in which the via plug 41 is formed. In the present embodiment, the thickness of the $SiO_2$ film 37 is made about 400 nm by the plasma-CVD method.

Next, the SiN film 49 as an etching stopper is formed on the $SiO_2$ film 37. In the present embodiment, the SiN film 49 is formed in about 30 nm thickness by CVD or the sputtering method.

Next, the $SiO_2$ film 45 as inter-layer film is formed on the SiN film 49. The $SiO_2$ film 45 corresponds to the second wiring layer in which the Cu wiring 43 is formed. In the present embodiment, the $SiO_2$ film 45 is formed in about 400 nm thickness by the plasma-CVD method.

Then, the via hole 38 of about 0.2 micrometer width is formed such that the Cu wiring 35 is exposed through the $SiO_2$ films 37 and 48 and the SiN film 49 by a photolithography/etching process. The via hole 38 is an upward opening in which the via plug 41 is formed. Then, photoresist on the $SiO_2$ film 45 is removed, and a surface of the $SiO_2$ film 45 including a surface of the via hole 38 is washed by a resist removal/washing process.

Figure 6A:
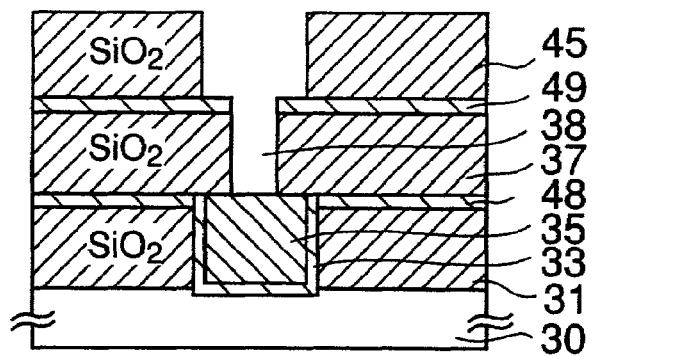
FIG. 6 is a flowchart of manufacturing process explaining a manufacturing method of the semiconductor device of the embodiments of the present invention.
Figure 6B:
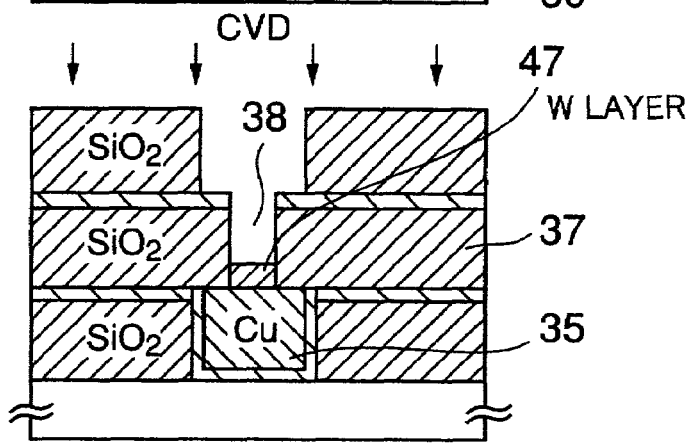

Next, the W layer 47 is formed by CVD, reference being made to FIG. 6(B). In the present embodiment, the W layer 47 is formed in 50 nm thickness, using tungsten hexacarbonyl W(CO)6 as the material.

Figure 7:
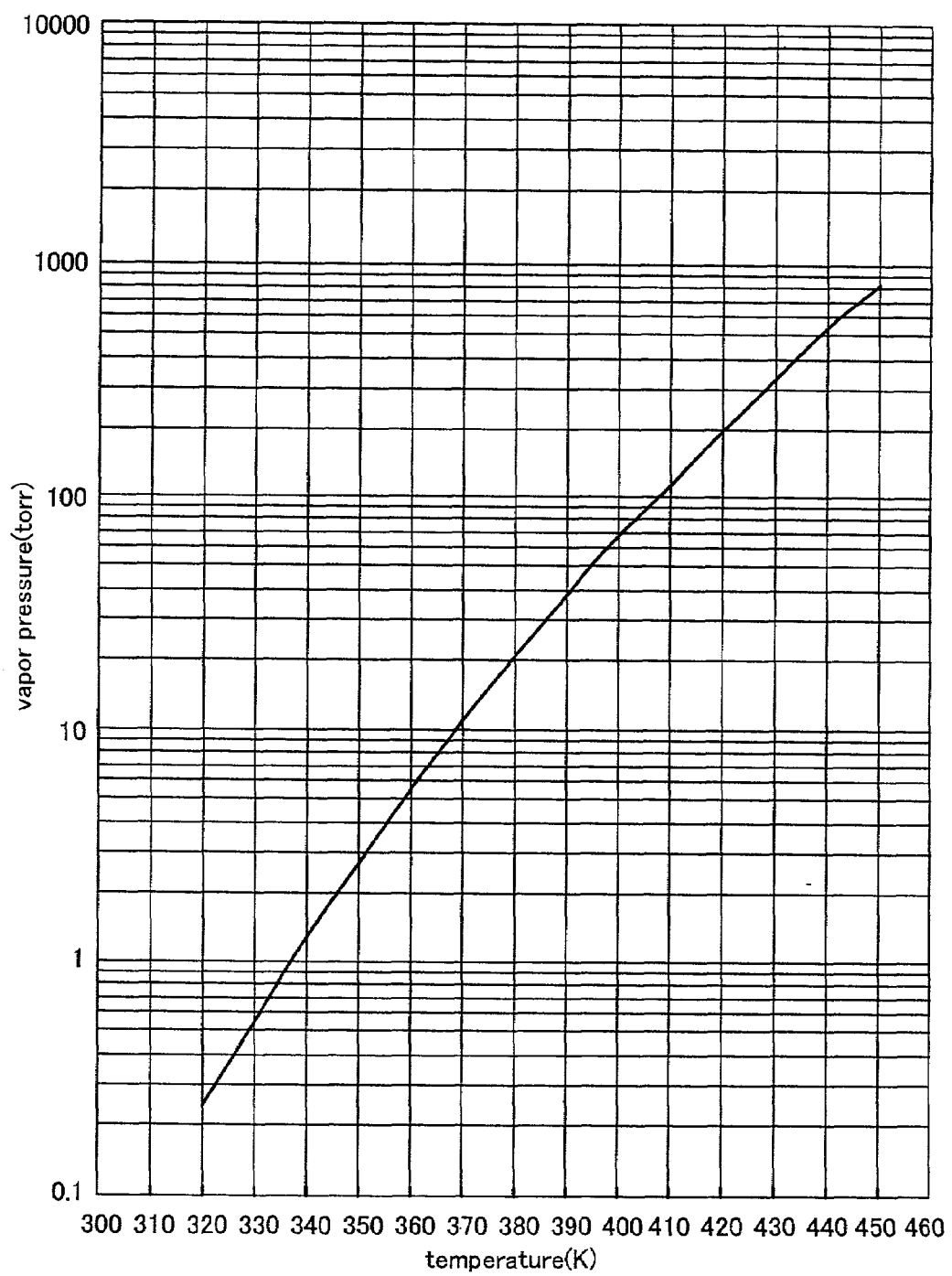
FIG. 7 is a figure showing vapor pressure of W(CO)6 used in the embodiments of the present invention.

FIG. 7 shows a vapor pressure curve of W(CO)6 used in the present embodiment. Since the vapor pressure of the W(CO)6 is comparatively high, the W(CO)6 can be easily supplied at a material temperature being normal temperature, and growth of W on a substrate (Cu in this case) is rate-determined by supply.

Further, since it is a selective growth inside the via hole, the growth under low gas pressure is desirable. Specifically, the growth was carried out at the substrate temperature of 300 degrees C., gas amount-of-supply 100 sccm, and pressure 100 pa. The growth rate of W in this case was 15 nm/min. W grows selectively in an area with many active spots. Therefore, W does not grow on the $SiO_2$ films 37 and 45, in this case. In addition, the selection ratio of Cu and $SiO_2$ at the time of depositing W(CO) 6 is infinite.

Thus, although W(CO)6 is supplied from above the $SiO_2$ film 45 by the CVD deposition process, deposition of W on the $SiO_2$ film 37 is suppressed by setting deposition conditions in a desirable range, and W(CO)6 is deposited selectively on the Cu wiring 35 exposed in the via hole 38, forming the W layer 47.

Figure 6C:
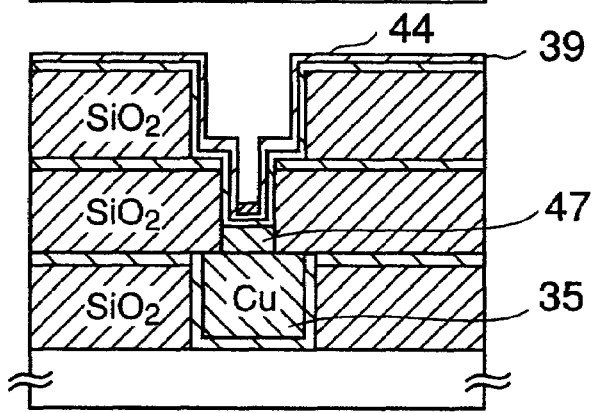

Next, with reference to FIG. 6(C), the barrier metal layer 39 and the Cu seed layer 44 are formed here. In the present embodiment, the barrier metal is formed in about 20 nm thickness by PVD, using a tantalum nitride (TaN) as a metal that forms the barrier metal layer 39. Further, the Cu seed layer 44 is formed in about 100 nm thickness.

Figure 6D:
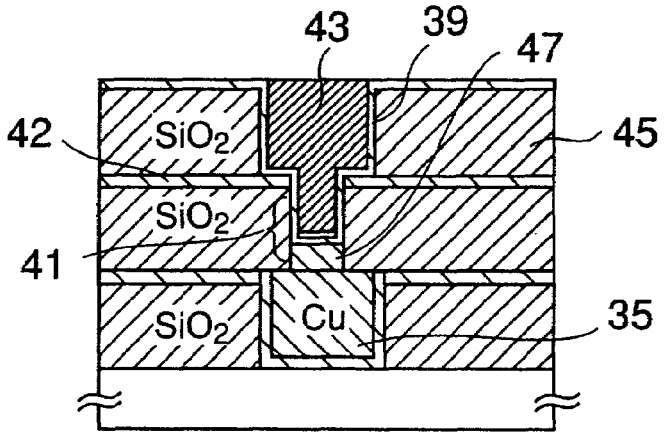

Next, with reference to FIG. 6(D), the plating film of Cu is formed by a plating process. This plating film is embedded to the via hole 38 and the opening area of an upper part of the via plug 38, and it is formed in about 300 nm thickness by electrolysis plating.

Then, the Cu seed layer, the barrier metal layer, and the Cu plating film (not shown), etc. that are formed above the second wiring layer ($SiO_2$ film 45) are removed by CMP process, and the process of the second wiring layer is finished. Thereby, the via plug 41 (Cu layer 42) and the Cu wiring 43 are formed.

As above, the manufacturing method of the semiconductor device of the embodiment is realized by the following processes. First, the Cu wiring 35 is formed on the SiO$_2$ film 31 prepared on the silicon substrate 10. Next, a wrap SiO$_2$ film 37 is formed for the Cu wiring 35, and the via hole 38 that penetrates this SiO$_2$ film 37 and exposes the Cu wiring 35 is formed.

The W layer 47, using tungsten with a melting point higher than Cu, is then formed on the Cu wiring 35 exposed in the via hole 38. Finally, the Cu layer 42 and the Cu wiring 43 are formed through barrier metal layer 39 and others.

According to this manufacturing method, tungsten (W) can be deposited selectively on the Cu wiring 35 in a CVD process by using W as a metal that forms the high melting-point metal layer. In this case, W(CO)6 can be used at a comparatively low temperature, and a highly thin layer can be formed by self-alignment.

The embodiments of the present invention have been explained as above, however, the present invention is not limited to the embodiments, but change of device structure, change of a parameter in the manufacturing process, etc. are possible. Hereafter, this point is explained.

In the embodiment above, only one layer (the W layer 47) of high melting-point metal is prepared in the lower part of the via plug 41 in order to maintain a high-speed operation and to suppress the migration of Cu. There, the undersurface of the W layer 47 touches the Cu wiring 35, and the upper surface of the W layer 47 touches the barrier metal layer 39, thereby the double contiguous Cu spreading prevention layer is formed. The present invention is not limited to this embodiment. For example, a single layer of tungsten (W) may be provided in an upper part of the via plug 41, as described in the following.

Figure 8:
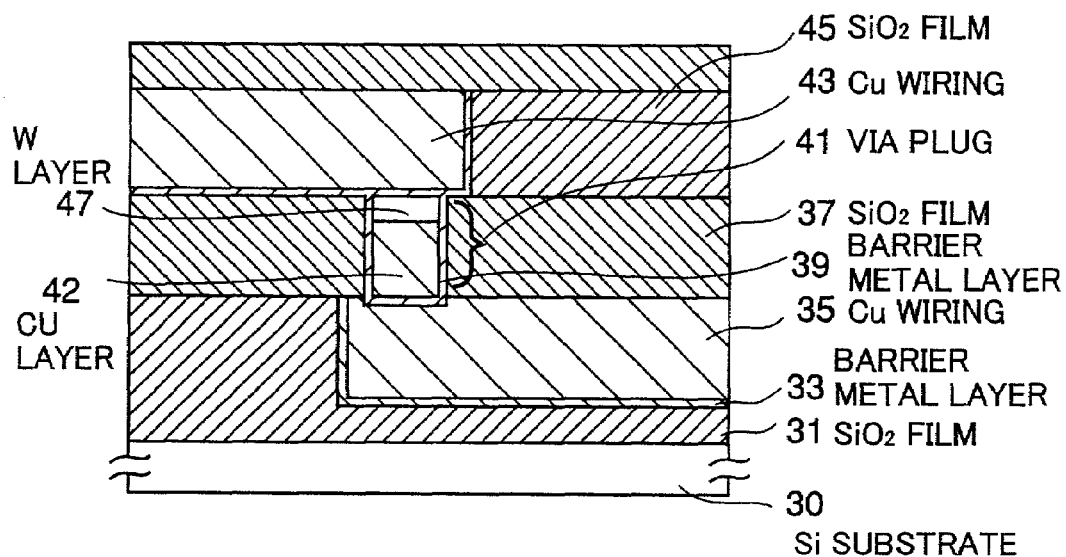
FIG. 8 is a figure explaining the wiring structure of the semiconductor device by another embodiment of the present invention.

FIG. 8 is a figure explaining the wiring structure of the semiconductor device of another embodiment of the present invention. In FIG. 8, the same reference numbers are is given to the same units as FIG. 2, and descriptions thereof are omitted.

In FIG. 8, a single layer of tungsten, W layer 47, is prepared in the upper part of the via plug 41. The W layer 47 touches the Cu layer 42 on the undersurface, and is in contact with the Cu wiring 43 through the barrier metal layer 39 on the upper surface.

Further, the wiring structure shown in FIG. 8 includes a double contiguous Cu spread prevention layer on the Cu wiring 43 side, while the double contiguous Cu spread prevention layer in FIG. 2 is provided on the Cu wiring 35 side. Furthermore, with the wiring structure of FIG. 8, the barrier metal layer 39 is provided at the lower part of the via plug 41, touching with the Cu wiring 35.

Thus, the W layer 47 is prepared in the lower part of the via plug 41 with the wiring structure shown in FIG. 2, and is prepared in the upper part of the via plug 41 with the wiring structure shown in FIG. 8. The W layer 47 may also be provided in a middle part of the via plug 41 such that the Cu wiring 35 and the Cu wiring 43 are not directly touched through the barrier metal layer.

Here, the process of forming the via plug 41 shown in FIG. 8 is explained corresponding to explanations of FIG. 6(B) and FIG. 6(C) 6. In this case, the two-layer wiring that has the lower layer wiring and the upper wiring is formed by a single damascene method.

First, the barrier metal layer 39 and the Cu seed layer 44 are formed by PVD in the structure of FIG. 6(A). Here, the barrier metal layer 39 is not formed in the opening of the via hole 38 at this stage. Next, a Cu plating film is embedded, and the Cu layer 42 is formed. Here, the opening of the via hole 38 is made higher than the upper surface of the Cu layer 42 by the thickness of the W layer 47, forming a convex. Next, tungsten (W) is deposited on the convex shaped opening portion by CVD, such that the W layer 47 is formed, and the via plug 41 is formed. Then, the barrier metal layer 39 is formed on the upper surface of the via plug 41, and the wiring process of the second wiring layer (Cu wiring 43) is performed.

In the embodiments described above, only one layer of high melting-point metal layers (W layer 47) is prepared in the via plug 41. The present invention is not limited to these embodiments, but rather two or more W layers 47 may be provided in the via plug 41, if a demand for a high-speed operation is somewhat relaxed. Hereafter, this point is explained in detail.

Figure 9:
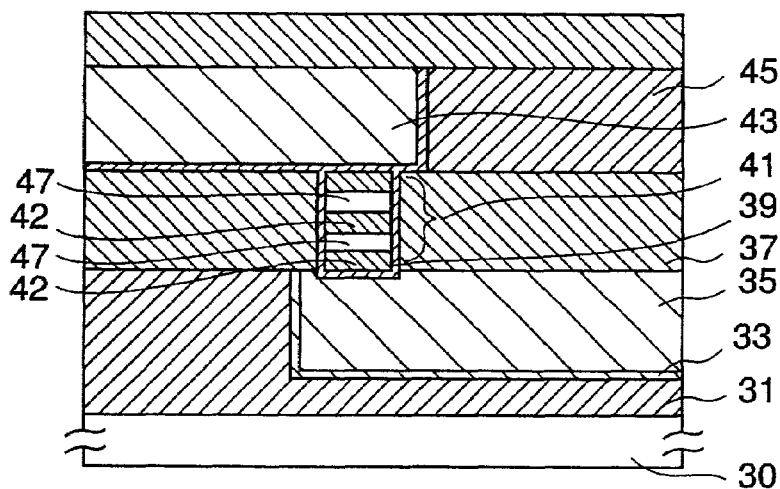
FIG. 9 is a figure explaining the wiring structure of the semiconductor device by another embodiment of the present invention.

FIG. 9 is a figure explaining the wiring structure of the semiconductor device of another embodiment of the present invention. In FIG. 9, the same reference numbers are given to the same units in FIG. 2, and explanations thereof are omitted.

In FIG. 9, two W layers 47 are prepared in the via plug 41. Each of the W layers 47 is in contact with the Cu layers 42 on the upper surface and undersurface. Specifically, the laminating is structured as (Cu wiring 35−) barrier metal layer 39-Cu layer 42-W layer 47-Cu layer 42-W layer 47-Cu layer 42-barrier metal layer 39 (-Cu wiring 43).

Each of the W layers 47 is not in contact with the barrier metal layer 39 prepared in the upper surface and the undersurface of the via plug 41, as illustrated in FIG. 9. In addition, wiring structure where one or both of the W layers 47 touch the barrier metal layer 39 of the upper part and the lower part is possible.

Here, the process of forming the via plug 41 shown in FIG. 9 is explained corresponding to explanations of FIG. 6(B), FIG. 6(C) and FIG. 8.

First, the barrier metal layer 39 and the Cu seed layer 44 are formed by PVD to the structure of FIG. 6(A). Here, the barrier metal layer 39 is not formed in the opening of the via hole 38 in this stage. Then, the process that embeds Cu plating film and forms the Cu layer 42, and the process that deposits the W layer 47 by CVD are repeated alternately, and the via plug 41 is formed. Then, the barrier metal layer 39 is formed on the upper surface of the via plug 41, and the wiring process of the second wiring layer (Cu wiring 43) is performed.

As mentioned above, the semiconductor device of the present invention includes the via plug 41 that includes at least one high melting-point metal layer (W layer 47) that forms a part of the thickness of the via plug 41. When a high-speed operation is required, it is desirable that the via plug 41 includes only one tungsten (W) layer.

With reference to FIG. 2, the wiring structure provides a double Cu spread prevention layer that is formed as Cu layer 35-W layer 47-barrier metal layer 39-Cu layer 42. The double Cu spread prevention layer can be structured with the W layer 47 and the barrier metal layer 39 exchanging their respective positions. Namely, the lamination of Cu wiring 35-barrier metal layer 39-W layer 47-Cu layer 42 may be formed.

With reference to FIG. 8, the double Cu spread prevention layer is formed by Cu layer 42-W layer 47-barrier metal layer 39-Cu wiring 43. The W layer 47 and the barrier metal layer 39 may be replaced, and the double Cu spread prevention layer may be structured by laminating Cu layer 42-W layer 47-barrier metal layer 39-Cu wiring 43.

As above, it is desirable that one of the W layer 47 and the barrier metal layer 39 is in contact with either the Cu wiring 35 or the Cu wiring 43, regardless of the laminating sequence of the W layer 47 and the barrier metal layer 39. Further, as shown in FIG. 8, for example, the barrier metal layer 39 may be placed on the side on which the double Cu spread prevention layer is not formed.

The manufacturing process of the semiconductor device of the present invention includes the process that forms the W layer 47 in the via hole 38, as a middle layer, which is thinner than the depth of the via hole 38, where W has a melting point higher than the melting point of Cu that forms the Cu wiring 35 and the Cu wiring 43. Further, the process includes forming the via plug 41 that fills the via hole 38, and contacts the W layer 47.

As mentioned, the embodiments have been described about the wiring structure, wherein Cu is used for metal wiring, and electric resistance of the via plug 41 is lowered, such that a high-speed operation is realized. However, the present invention is not limited to these embodiments. For example, the present invention can be applied to other metal wiring similar to Cu metal wiring. In this case, a metal material that has a higher melting point than the melting point of the metal material used for wiring is chosen based on the melting point and specific resistance of the metal materials shown in FIG. 3 as the high melting-point metal, and thickness of the selected high melting-point metal is adjusted according to the selected high melting-point metal. Different from aluminum wiring material, Cu wiring material has a problem that Cu diffuses into an insulating layer between metal layers. A barrier is provided at the Cu wiring layer in order to prevent Cu particles of the Cu wiring material weakened by the diffusion from being flushed away by electrons. This problem is much more serious than in aluminum wiring. Covering the whole internal surface of contact via with blanket CVD is not a good idea, because that contacting strength would be weakened.

Further, the present invention is not limited to these embodiments, but various variations and modifications may be made without departing from the scope of the present invention.

The present application is based on Japanese priority application No. 2001-260377 filed on Aug. 29, 2001 with the Japanese Patent Office, the entire contents of which are hereby incorporated by reference.

What is claimed is:

1. A semiconductor device, comprising:
an inter-layer insulation film;
a first wiring prepared on an upper surface of the inter-layer insulation film;
a second wiring prepared under a lower surface of the inter-layer insulation film,
wherein the first wiring and the second wiring are formed by one of copper and a copper alloy;
a via plug that connects the first wiring and the second wiring through the inter-layer insulation film, the via plug including at least one layer formed by one of copper and copper alloy and at least one layer of a high melting-point metal for suppressing electromigration of copper atoms of said one of copper and copper alloy between the first wiring and second wiring, said layer of high melting-point metal does not extend on a top surface of the inter-layer insulation film and has a melting point higher than a melting point of a metal that forms the first wiring and the second wiring; and
a barrier metal layer that touches the first wiring,
wherein the high melting-point metal layer electrically contacts the first wiring via the barrier metal layer.

2. The semiconductor device as claimed in claim 1, wherein the via plug comprises one high melting-point metal layer.

3. The semiconductor device as claimed in claim 1, wherein the high melting-point metal layer touches one of the first wiring and the second wiring through a barrier metal layer.

4. The semiconductor device as claimed in claim 1, wherein the high melting-point metal layer of the via plug is formed by tungsten.

5. The semiconductor device as claimed in claim 1, wherein the high melting-point metal layer is formed in thickness between 10 nm and 100 nm.

6. The semiconductor device as claimed in claim 1, wherein the high melting-point metal layer and the barrier metal layer form a double electro migration prevention layer.

* * * * *

UNITED STATES PATENT AND TRADEMARK OFFICE
CERTIFICATE OF CORRECTION

PATENT NO. : 7,279,790 B2  
APPLICATION NO. : 10/105286  
DATED : October 9, 2007  
INVENTOR(S) : Hideki Kitada et al.

Page 1 of 1

It is certified that error appears in the above-identified patent and that said Letters Patent is hereby corrected as shown below:

On the Title Page:
In item (75) Inventors name change "Hideki Kitada, Kawasaki (JP); Noriyoshi Shimizu, Kawasaki (JP); Nobuyuki Ohtsuka, Kawasaki (JP); Takayuki Ohba, Kawasaki (JP)"

to read:
-- Hideki Kitada, Kawasaki (JP); Noriyoshi Shimizu, Kawasaki (JP); Takayuki Ohba, Kawasaki (JP) --

Signed and Sealed this

Eighteenth Day of August, 2009

David J. Kappos
*Director of the United States Patent and Trademark Office*